(12) United States Patent
Prinz et al.

(10) Patent No.: US 6,898,128 B2
(45) Date of Patent: May 24, 2005

(54) PROGRAMMING OF A MEMORY WITH DISCRETE CHARGE STORAGE ELEMENTS

(75) Inventors: Erwin J. Prinz, Austin, TX (US); Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/622,353

(22) Filed: Jul. 18, 2003

(65) Prior Publication Data

US 2005/0013173 A1 Jan. 20, 2005

(51) Int. Cl.[7] .............................................. G11C 16/00
(52) U.S. Cl. ........................ 365/185.28; 365/185.18; 365/185.23
(58) Field of Search ................... 365/185.28, 185.18, 365/185.22, 185.23

(56) References Cited

U.S. PATENT DOCUMENTS

| | | | | |
|---|---|---|---|---|
| 6,011,725 | A | | 1/2000 | Eitan .................... 365/185.33 |
| 6,243,300 | B1 | * | 6/2001 | Sunkavalli ............. 365/185.29 |
| 6,356,482 | B1 | | 3/2002 | Derhacobian et al. . 365/185.29 |
| 6,714,447 | B2 | * | 3/2004 | Satoh et al. ........... 365/185.02 |
| 6,744,675 | B1 | * | 6/2004 | Zheng et al. .......... 365/185.28 |
| 6,788,576 | B2 | * | 9/2004 | Roizin .................... 365/185.1 |

OTHER PUBLICATIONS

Fujiwara, I. et al.; "High speed program/erase sub 100 nm MONOS memory cell"; Advanced Devices R&D Laboratories, LSI, SNC, Sony Corporation; pp. 75–77.

Chan, T.Y. et al.; "A True Single–Transistor Oxide–Nitride–Oxide EEPROM Device"; IEEE Electron Device Letters; Mar., 1987; pp. 93–95; vol. EDL–8; No. 3.

Specification; U.S. Appl. No. 10/280,294, filed Oct. 25, 2002, Craig T. Swift et al.

* cited by examiner

*Primary Examiner*—Tan T. Nguyen
(74) *Attorney, Agent, or Firm*—Robert L. King; Susan C. Hill (57) ABSTRACT

A non volatile memory (100) includes an array (102) of transistors (30) having discrete charge storage elements (40). The transistors are programmed by using a two step programming method (60) where a first step (68) is hot carrier injection (HCI) programming with low gate voltages. A second step (78) is selectively utilized on some memory cells to modify the injected charge distribution to enhance the separation of charge distribution between each memory bit within the transistor memory cell. The second step of programming is implemented without adding significant additional time to the programming operation. In one example, the first step injects electrons and the second step injects holes. The resulting distribution of the two steps removes electron charge in the central region of the storage medium.

21 Claims, 7 Drawing Sheets

PROGRAMMING OF A MEMORY WITH DISCRETE CHARGE STORAGE ELEMENTS

CROSS REFERENCE TO RELATED APPLICATION

This application is related to copending U.S. application Ser. No. 10/280,294, entitled "Erase of A Memory Having A Non-Conductive Storage Medium" filed on Oct. 25, 2002 and assigned to the assignee herein.

FIELD OF THE INVENTION

This invention relates to non-volatile memories, and more particularly to programming non-volatile memories having discrete charge storage elements.

RELATED ART

Non-volatile memories that use discrete charge storage elements, such as electron and hole traps in nitride, are programmed typically by inserting electrons into the discrete charge storage elements. Because the storage medium is non-conductive, there is little movement of the electrons within the storage medium. One of the typical and most effective ways of inserting electrons into the nitride is hot carrier injection (HCl). This has the effect of injecting electrons into the nitride in a non-uniform manner. The charge density is highest where the electrons are the most energetic, which is typically near the drain. The result is that the electrons are more concentrated in the nitride in the area closest to the drain. This is effective for providing a sufficient change in threshold voltage of the memory cell to be detectible.

A problem, however, is that erasing the memory cell should neutralize all of the electrons that are charging the storage medium, which may be difficult. A way to do that is by direct tunneling, but direct tunneling requires that the bottom oxide, the dielectric between the substrate and the nitride, has to be quite thin, in the range of 20–30 Angstroms. In arrays of single-transistor bitcells, however, thin bottom oxides lead to insufficient data retention and read disturb. Another approach is Fowler-Nordheim (FN) tunneling which allows for a little bit thicker bottom oxide but still not exceeding 30 Angstroms. This bottom oxide should be kept this thin to prevent erase times from becoming very long or causing the difference between the programmed and erased threshold voltages being too close together due to back injection of electrons through the top oxide during erase.

Another technique is hot hole injection. This provides for holes being injected into the nitride to neutralize the electrons in the nitride. The hot holes are also created near the drain by providing a reverse bias on the PN junction and a negative voltage on the control gate. These bias conditions cause the formation of hole/electron pairs. Some of these holes are accelerated between the drain and the substrate to sufficient energy to surmount the potential barrier between the substrate and the nitride. These holes that are able to reach the nitride do so according to a pattern. Although this pattern is similar to that for the programming using HCl, it is not the same. T. Y. Chan et al. in "A True Single-Transistor Oxide-Nitride-Oxide EEPROM Device", IEEE Electron Device Letters, Vol. EDL-8, No. 3, March 1987, describe memory programming with a simultaneous high gate voltage and drain voltage which creates a saturation condition for the transistor. Programming in the saturation condition creates an electron distribution that is localized in the drain with a relatively wide distribution. This programming uses HCl and tends to have not just one peak near the drain but also an additional peak a little further from the drain. Hot hole injection (HHI) does not tend to have this second peak so that the electrons injected as part of the second peak are not neutralized very effectively by HHI. Thus, electrons tend to be left in the nitride when using HHI erase. After write/erase cycling, the accumulated electrons cause the erased threshold voltage to increase, leading to insufficient voltage margins for memory operation.

Figure 1:
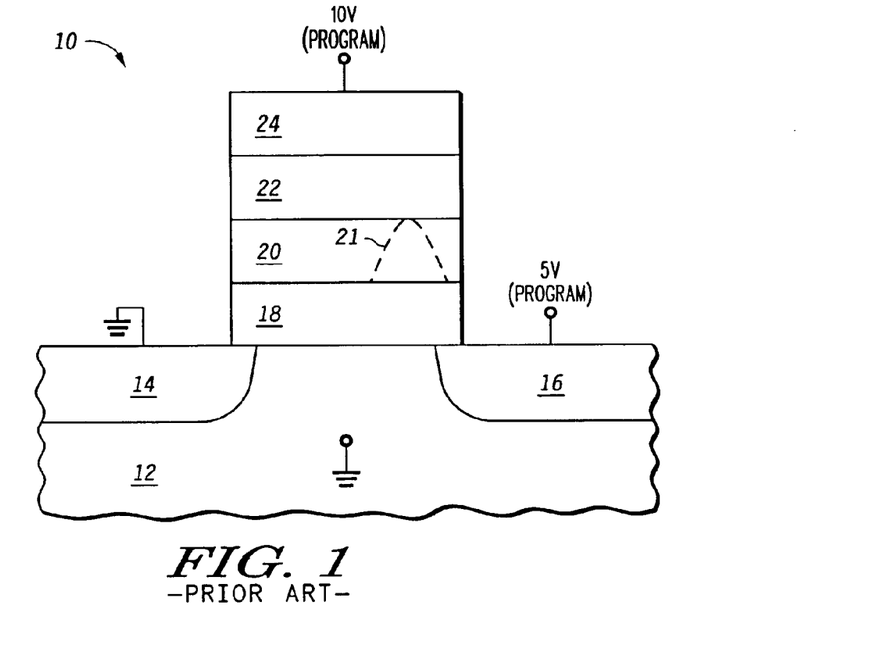
FIG. 1 illustrates a cross section of a conventional memory cell being programmed with a high gate voltage and showing a resulting narrow electron distribution.

One technique that is used to avoid the accumulation of electrons in the storage medium is to create an electron distribution that substantially matches the hot hole distribution in the storage medium. To accomplish the matching, a high gate voltage is used. Shown in FIG. 1 is such a known memory cell 10. Memory cell 10 has a substrate 12 with a gate stack structure between a source 14 and a drain 16. The gate stack structure has a gate dielectric 18, an overlying charge storage layer 20 having a plurality of discrete charge storage elements, an overlying dielectric layer 22 and a conductive upper gate electrode 24. The plurality of discrete charge storage elements may be implemented in various forms. In one form, the discrete charge storage elements may be nanoclusters made of silicon, germanium, nitride, etc., nanocrystals, or a nitride layer or any layer of material that traps electrons and/or holes. In a program mode, the source 14 is connected to an earth ground potential, the gate is connected to ten volts and the drain is connected to five volts or lower. Under the high gate voltage and low drain voltage biasing condition, the channel region between the source and the drain is in a substantially linear region of operation. This results in injection of hot electrons into the charge storage medium 20 near the side of the drain 16 resulting in a narrow electron distribution. Narrow electron distribution allows storing two discrete data states within a single memory cell at each of the two source/drain terminals without substantial cross-interference between the two bits in the memory cell. However, use of the high gate voltage requires large peripheral transistors capable of handling such high gate voltages. In order to withstand gate voltages such as ten volts, the transistors must use a thick gate oxide that directly increases the size of the required peripheral circuitry. Existing non-volatile memory modules that use a storage medium layer with a gate bias sufficiently high for charge localization typically have a size disadvantage especially when fast read access time is required.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 2:
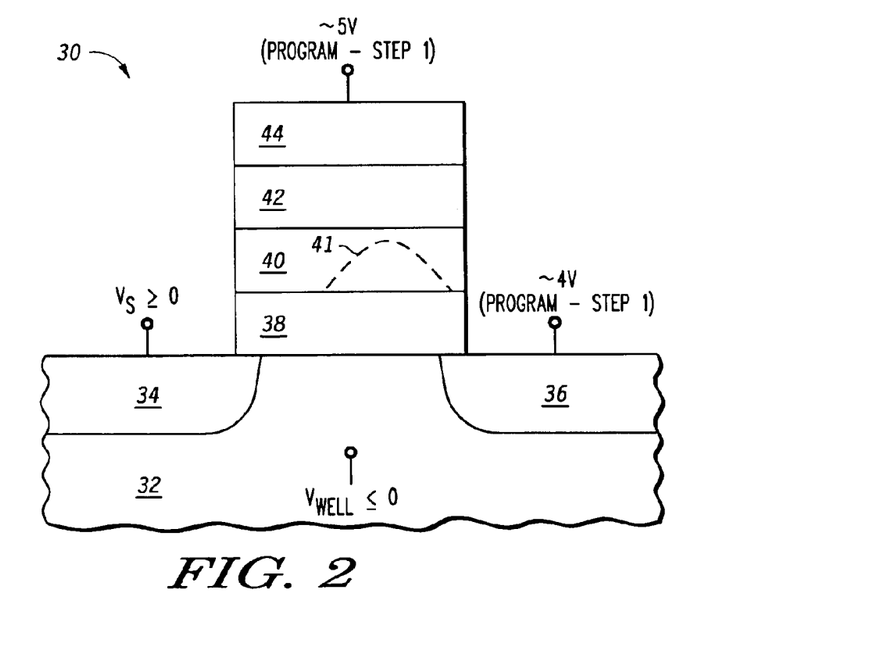
FIG. 2 illustrates a cross section of a memory cell that is programmed in a first step using a low gate voltage and showing a resulting wide electron distribution in accordance with the present invention.

Illustrated in FIG. 2 is a memory cell 30 that has been programmed in a first step of a programming method in accordance with the present invention. Generally, memory cell 30 has a well 32 containing an implanted source 34 and an implanted drain 36. A gate structure is formed of a gate dielectric 38, a charge storage element layer 40, a control dielectric 42 and a conductive gate electrode 44. The conductive gate electrode 44, the source 34 and the drain 36 each have a terminal for receiving a predetermined voltage. The conductive gate electrode 44 is connected to a voltage of approximately five volts. The well 32 is connected to a voltage $V_{WELL}$ of either zero volts or less than zero by an amount such as negative two volts. The source 34 is connected to a source voltage $V_s$ that is either zero or greater than zero by an amount such as, for example, one volt. The drain voltage is connected to a drain voltage of approximately four volts. It should be well understood that the voltage values provided herein are given by way of example only and are not intended to be precise values. The gate dielectric 38, in one form, has a thickness of approximately fifty Angstroms. The charge storage element layer 40 has a thickness depending upon what type of charge storage material is used. If a nitride layer is implemented, the thickness is, in one form, approximately one hundred Angstroms. If nanocrystal material is used, the diameter of the nanocrystals is, for example, approximately fifty Angstroms, and the separation between the nanocrystals is, for example, approximately fifty Angstroms. The control dielectric 42 is, for example, approximately one hundred Angstroms. The conductive gate electrode 44 is, for example, approximately one thousand Angstroms. Additionally, the channel length between source 34 and drain 36 is, in one form, approximately in the range of one hundred nanometers to three hundred nanometers.

In operation, under the illustrated biasing condition the channel is operating in a saturation region for memory cell 30. The saturation condition results from the gate being biased at a voltage that is very close in value to the drain bias voltage. Under a saturation condition, the distribution of injected electrons is illustrated by distribution 41. The distribution 41 is wider than distribution 21 of FIG. 1. While the wider distribution is more problematic for a two bit memory cell, this operation is preferred over memory cell 10 because the gate bias is approximately one-half and therefore results in much smaller peripheral transistors and consequently a much smaller memory module. A wider electron distribution is not effectively removed using hot hole injection during an erase operation since the hole distribution does not match the electron distribution. An incomplete removal of the injected electron distribution results in an undesired accumulation of the electrons in the middle of the charge storage medium such as charge storage element layer 40.

Figure 3:
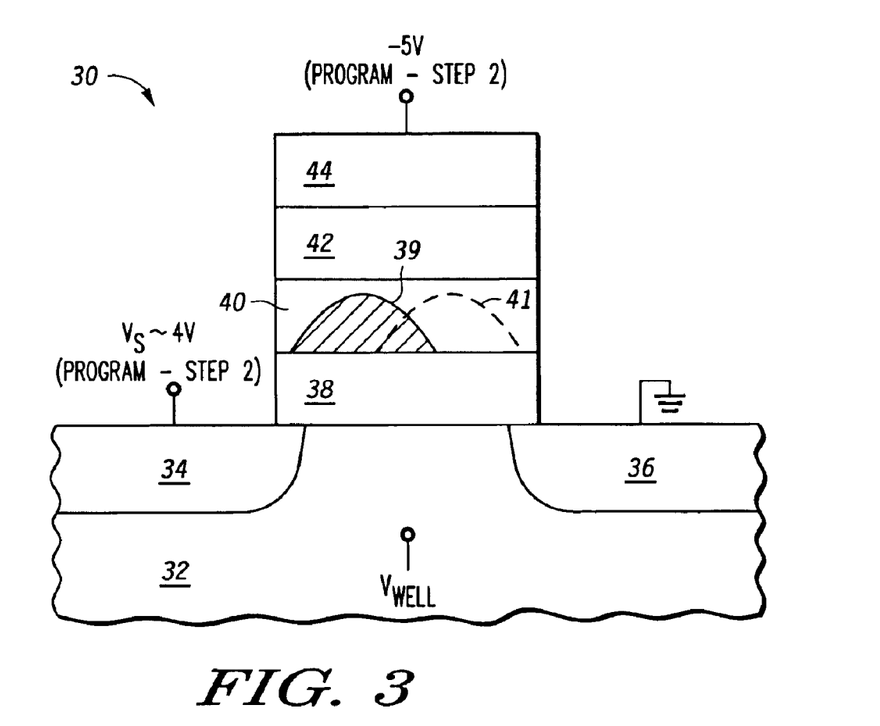
FIG. 3 illustrates a cross section of a memory cell that is programmed in a second step using a low gate voltage and showing both a hole and an electron distribution in accordance with the present invention.

Illustrated in FIG. 3 is a cross section of a second programming step associated with memory cell 30. The biasing conditions are to place approximately negative five volts on the gate electrode 44 and to place the drain 36 at an earth ground reference potential. Additionally, the source 34 is biased at approximately four volts and a back bias voltage, $V_{WELL}$, is connected to well 32. An example of $V_{WELL}$'s potential is zero or a non-zero value less than zero, such as negative one or two volts.

Under this biasing condition, electron-hole pairs are generated in the portion of source 34 that underlies gate dielectric 38. The generated holes are accelerated towards the source 34 due to a lateral electric field that exists between source 34 and the well 32. This lateral transport increases the energy of the holes and the holes are injected into the charge storage element layer 40 due to the negative gate voltage. The resulting hole distribution 39 is illustrated in FIG. 3. A part of the hole distribution 39 overlaps the electron distribution 41 and therefore cancels or cleans that part of the charge storage medium of electron charge. The effect of these combined distributions is to remove or compensate the electron distribution in the center of the charge storage element layer 40 and effectively moving or shifting the electron distribution closer to the desired side of the charge storage element layer 40 which is closer to terminal 36 than terminal 34.

Figure 4:
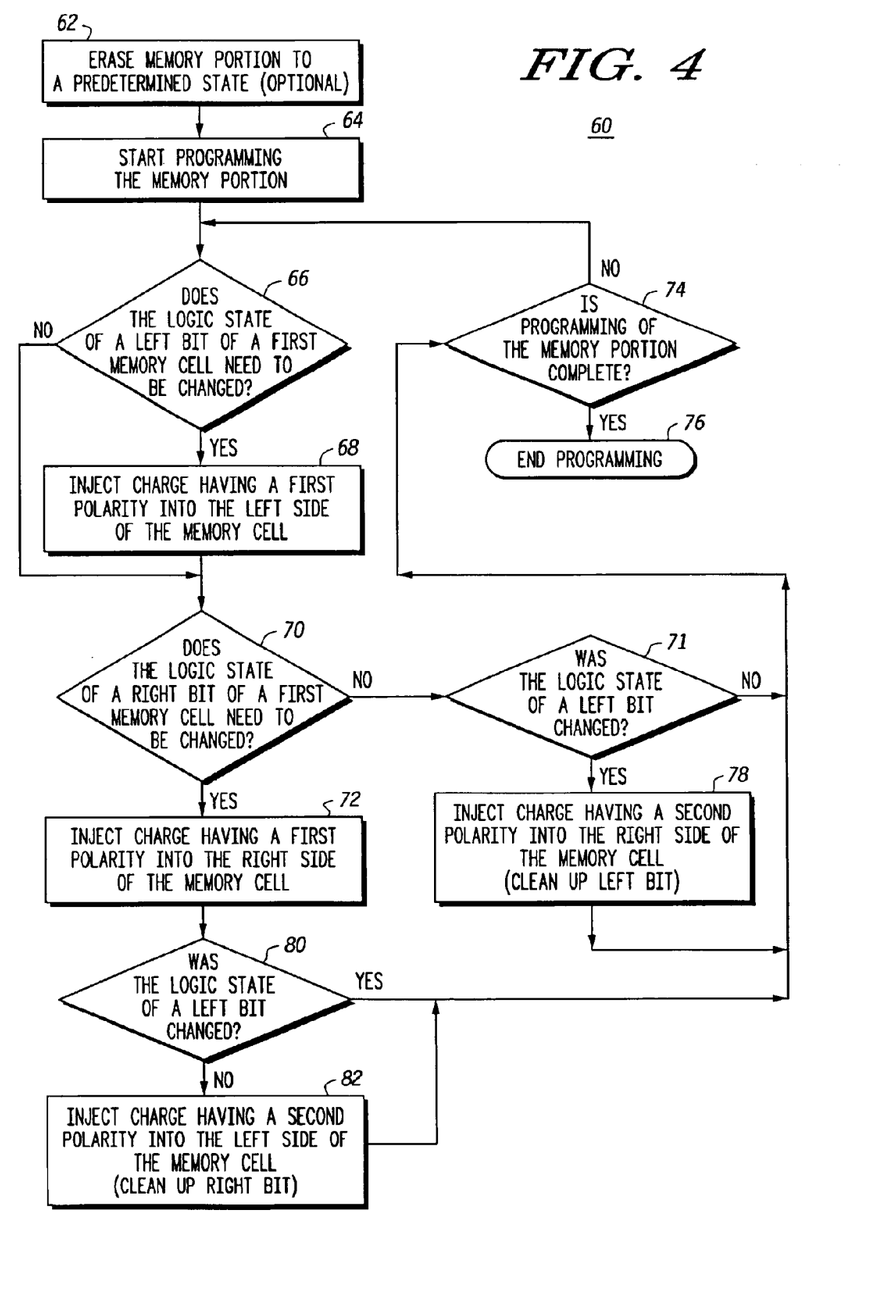
FIG. 4 illustrates a flow chart methodology of the memory programming; illustrated in FIGS. 2 and 3.

Illustrated in FIG. 4 is a flowchart of the method of programming memory cell 30 of FIGS. 2 and 3. In a step 62, a memory portion (one or more predetermined and identified memory cells) are erased to a predetermined state. The step 62 is optional and can be effectively accomplished using a conventional bulk erase. It should be understood that when step 62 is implemented, the memory cell storage medium is void of any effective charge distribution. If step 62 is not performed, additional logic circuitry in a memory system is required in order to start with a known charge distribution. In a step 64, the programming of the memory portion is started by activating the memory into a program mode. In a step 66, a determination is made whether the logic state of a left bit of a first memory cell needs to be changed in value from what is desired to be stored in the first memory cell. If the logic state of the first memory cell must be changed, a step 68 is performed. In step 68, charge having a first polarity is injected into the left side of the memory cell as previously discussed in connection with FIG. 2. If the logic state of the first memory cell does not need to be changed, then step 68 is not performed. In a step 70, a determination is made as to whether the logic state of a right bit of the first memory cell needs to be changed in value from what is desired to be stored in the second memory cell. If the logic state of the second memory cell must be changed, a step 72 is performed. In step 72, charge having the first polarity is injected into the right side of the memory cell. In a step 80 a determination is made as to whether the logic state of the left bit was changed. If the logic state of the left bit changed, a step 74 is performed. If the logic state of the left bit did not change, a step 82 is performed. In step 82 charge having a second polarity is injected into the left side of the memory cell in order to clean up or remove the electron distribution in the center region of the channel. After step 82, step 74 is implemented. If in step 70 the logic state of the right bit of the first memory cell does not need to be changed, a step 71 is implemented. In step 71 a determination is made as to whether the logic state of a left bit is changed. If the logic state of the left bit is changed, a step 78 is performed. In step 78 charge having a second polarity is injected into the right side of the memory cell to clean up or remove the electron distribution in the center region of the channel. After step 78, step 74 is performed. In step 74 a determination is made as to whether the programming of the memory portion is complete. If the programming of the memory module is complete, then the programming mode is ended by a step 76. If the programming is not complete, the method is repeated by returning to step 66 and repeating the above described method for a subsequent memory cell.

Figure 5:
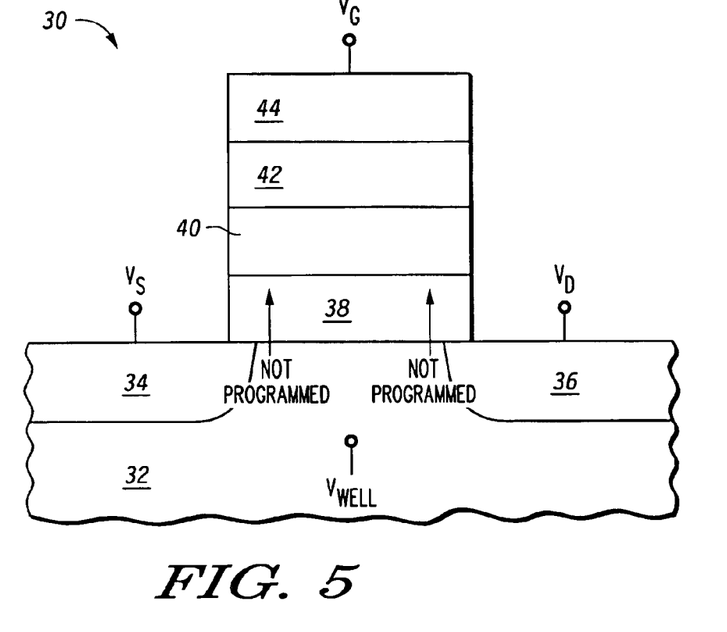
FIG. 5 illustrates a cross section of a two bit memory cell that has neither bit programmed.

Illustrated in FIG. 5 is a cross section of memory cell 30 that uses two bits and neither bit is programmed. For convenience of illustration, the same reference numbers will be used in connection with FIGS. 5–8 as were used in connection with FIGS. 2 and 3. The two bits are represented respectively on the left side and right side of the charge storage element layer 40. Since neither bit is programmed, there is no charge distribution present in the charge storage element layer 40. Therefore, no clean up or modification of electron distribution curves is required.

Figure 6:
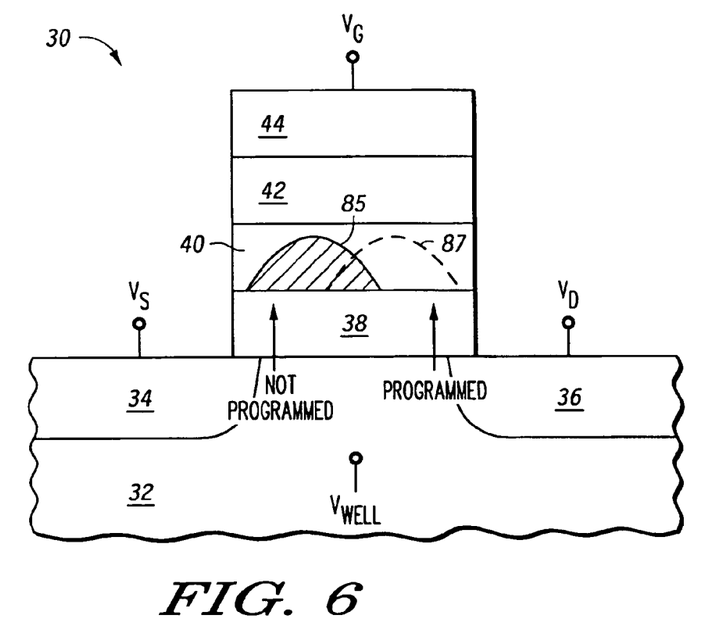
FIG. 6 illustrates a cross section of a two bit memory cell that has a right-most bit programmed.

Illustrated in FIG. 6 is a cross section of memory cell 30 that uses two bits where the bit on the left is not programmed and the bit on the right is programmed. A resulting hole distribution 85 and electron distribution 87 is illustrated. Under this condition a clean up or modification of the electron distribution on the left and center part of the charge storage element layer 40 as described in connection with FIG. 3 is performed.

Figure 7:
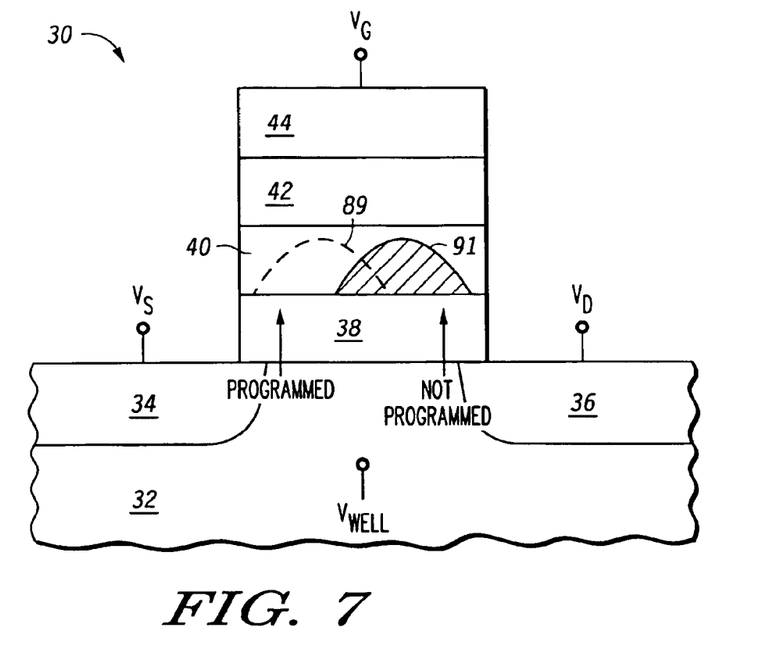
FIG. 7 illustrates a cross section of a two bit memory cell that has a left-most bit programmed.

Illustrated in FIG. 7 is a cross section of memory cell 30 that uses two bits where the bit on the left is programmed and the bit on the right is not programmed. A resulting electron distribution 89 and hole distribution 91 is illustrated. Under this condition a clean up or modification of the electron distribution on the right and center part of the charge storage element layer 40 as described in connection with FIG. 3 is performed. It should be noted that in FIG. 3 the voltage biasing conditions are shown for performing a clean up of the left side of charge storage element layer 40. Therefore, in order to clean up the right side of the charge storage element layer 40, the source voltage Vs must be set to the ground reference potential and the drain voltage is set to approximately four volts. The well remains at a substantially zero or slightly less potential. Additionally, the gate voltage remains at a low negative voltage, such as negative five volts.

Figure 8:
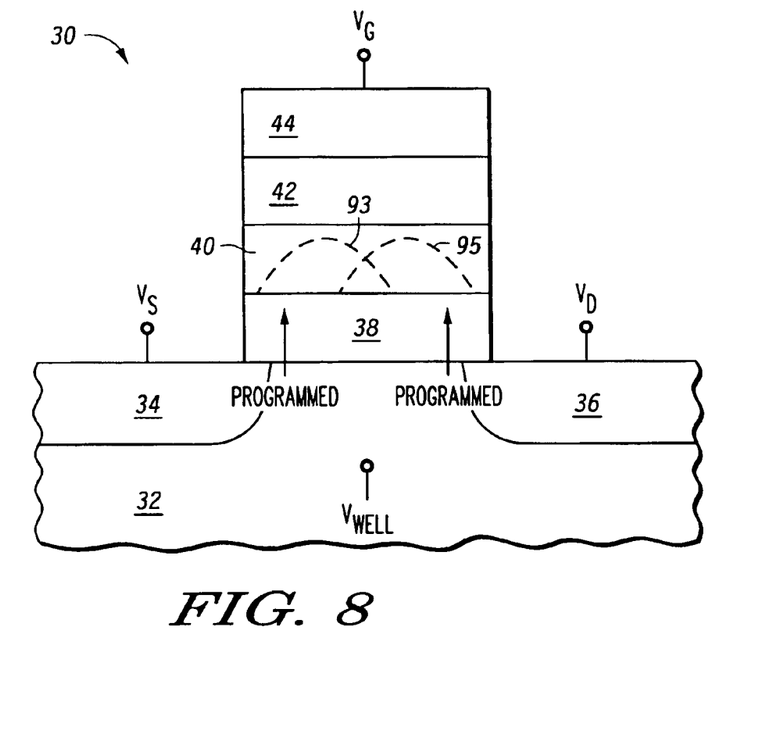
FIG. 8 illustrates a cross section of a two bit memory cell that has both bits programmed.

Illustrated in FIG. 8 is a cross section of memory cell 30 where both bits are programmed. Resulting electron distributions 93 and 95 are illustrated. Again, the two bits are represented respectively on the left side and right side of the charge storage element layer 40. Since both bits are programmed, the transistor of the memory cell is always nonconductive. As a result, there is no need to distinguish logic states of the two bits. Therefore, no clean up or modification of electron distribution curves is required. Additionally, when a bulk erase of the memory system is performed, the charge distributions of this bit cell are cleared resulting in no net accumulation of electrons in the center of the charge storage element layer 40.

Figure 9:
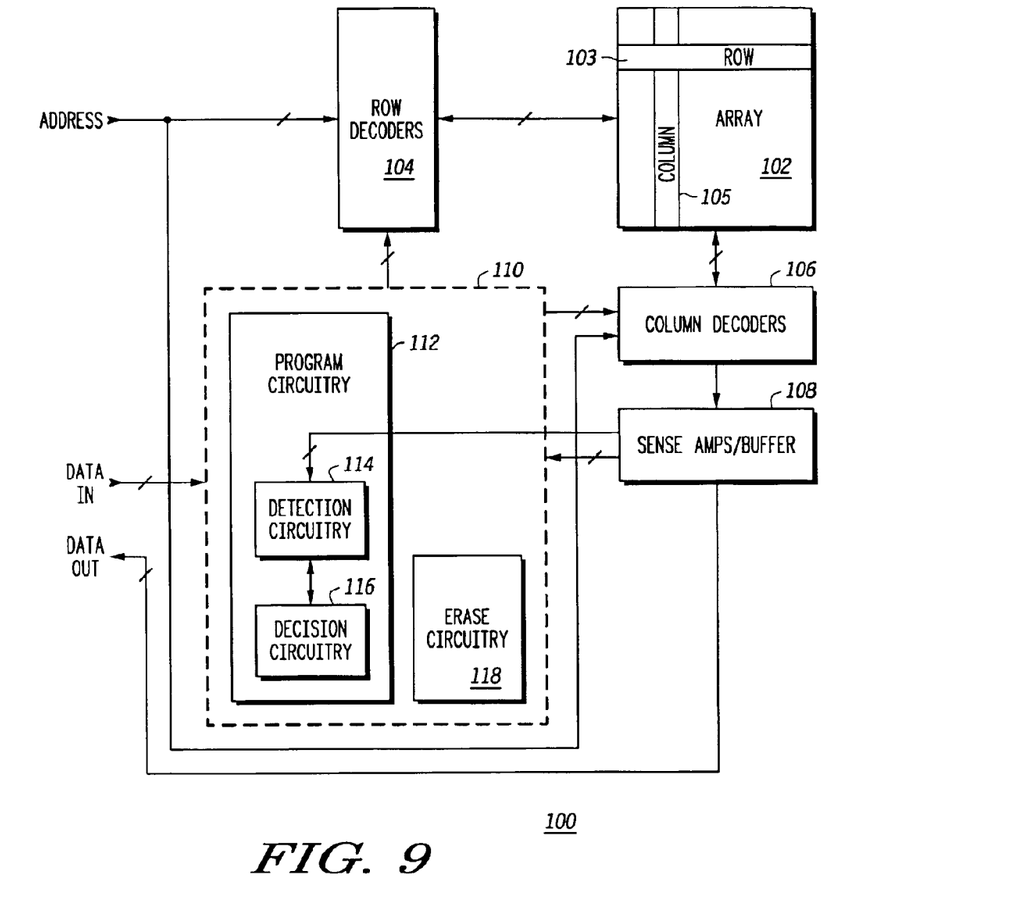
FIG. 9 illustrates a memory architecture for use with the programming methodology of FIG. 4.

Illustrated in FIG. 9 is a memory system 100 containing a memory array 102 for being programmed in accordance with the programming method of FIG. 4. Memory array 102 has rows, such as a row 103, and columns, such as column 105, that form a memory cell at the intersection thereof. In the illustrated form, memory system 100 has row decoders 104 that receive an address. The row decoders 104 communicate with the memory array 102 via a bi-directional bus. Column decoders 106 also communicate with memory array 102 via a bi-directional bus. Column decoders 106 have an output connected to an input of sense amplifiers and buffer 108. Program/Erase circuitry 110 is coupled to each of row decoders 104, column decoders 106 and the sense amplifiers/buffer 108. The Program/Erase circuitry 110 generally has program circuitry 112 and erase circuitry 118. The erase circuitry 118 is connected to the row decoders 104, the column decoders 106 and the sense amplifiers/buffer 108 through the illustrated connections of Program/Erase circuitry 110. The program circuitry 112 generally has detection circuitry 114 having an input connected to an output of the sense amplifiers/buffer 108. An input/output of detection circuitry 114 is connected via a bi-directional bus to decision circuitry 116. A data bus for communicating data is connected to the program circuitry 112 and erase circuitry 118 of program/erase circuitry 110. The address input is also connected to address inputs of the column decoders 106. The sense amplifier/buffer 108 has an output for providing output data. The row decoders 104 are connected to the program/erase circuitry 110 via a bi-directional bus.

In operation, memory system 100 functions to receive an input memory address for a memory cell to be programmed. The row decoders 104 and column decoders 106 function to identify and select a predetermined memory cell at an intersection of a row and column within the memory array 102. The program circuitry of the program/erase circuitry 110 functions to go through the programming steps described in FIG. 4 on a multiple memory cell basis in parallel. Detection circuitry 114 functions to determine which memory cells, on a row by row basis preferably, that need to have a clean up operation performed. Decision circuitry 116 functions to determine which side of the memory cell to inject the clean up charge. The advantage of performing the clean up operation on a row by row basis is that the effective programming speed is not significantly degraded as compared to programming using a single HCI step. HCI programming operation is fast as compared to the hot hole injection clean up operation described herein. Therefore by performing hot hole injection on a row by row basis significant programming time savings are realized.

In one form, the second step of the memory programming is implemented on a row by row basis by biasing an entire row to a negative potential. In particular, the one of the source or drain is positively biased based on whether or not clean up is required depending on left/right side. Parallel operation is possible because the programming with low gate and source/drain voltages allow a low current clean-up operation using hole injection.

In another form, the second step 64 of the memory programming is implemented on a column-by-column basis by biasing an entire column to a positive potential. In particular, one of the source or drain of a column is first biased positively while holding the other of the source or drain at ground potential, and one or more rows are negatively biased based on whether or not clean-up is required. The clean-up is required only if dissimilar charge states are stored in the two bits of a memory cell. If the source is first biased to a positive potential, then the clean-up occurs on the source side and center region of the charge storage medium for rows that are biased negatively. In the next step, the drain of the same column is biased positively, and the procedure is repeated. Parallel operation is possible because the programming with low gate and source/drain voltages allow a lower current clean-up operation using hole injection.

Figure 10:
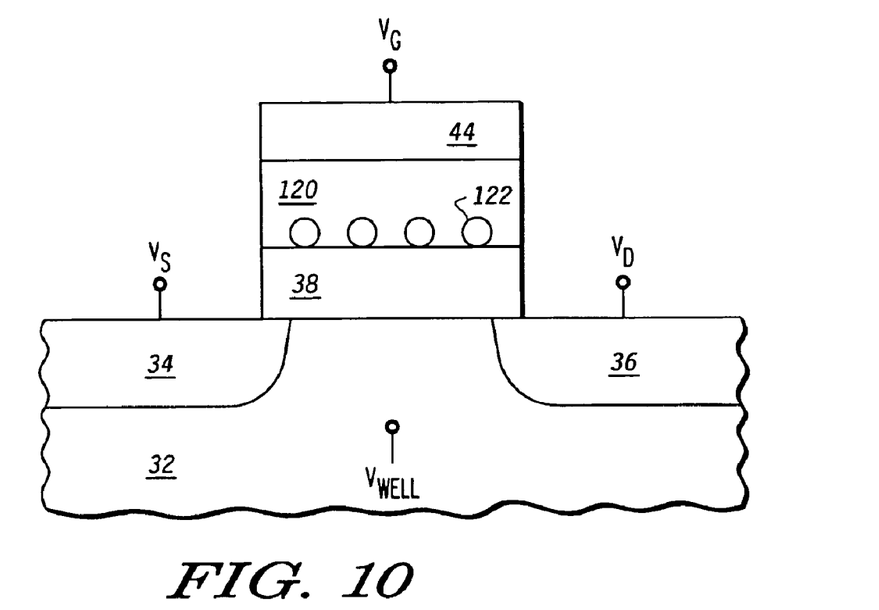
FIG. 10 illustrates in further detail one form of the charge storage element layer of the two bit memory cell described herein.

Illustrated in FIG. 10 is a further detail of the memory cell 30 of FIG. 2 wherein the charge storage element layer 40 is implemented by a layer 120 having a single layer of dots, nanoclusters or nanocrystals such as nanocrystal 122. For the convenience of illustration, elements in FIG. 10 that are equivalent or the same as in FIG. 2 are given the same number. Layer 120 is deposited on the gate dielectric 38 and functions as a charge trapping layer. The gate dielectric 38 is either deposited or grown. Either a single layer or multiple layers of nanocrystals, each with a diameter for example of approximately fifty Angstroms are deposited. All other components of the two bit memory cell, including the control dielectric 42 and the gate electrode 44 are formed as previously described.

Figure 11:
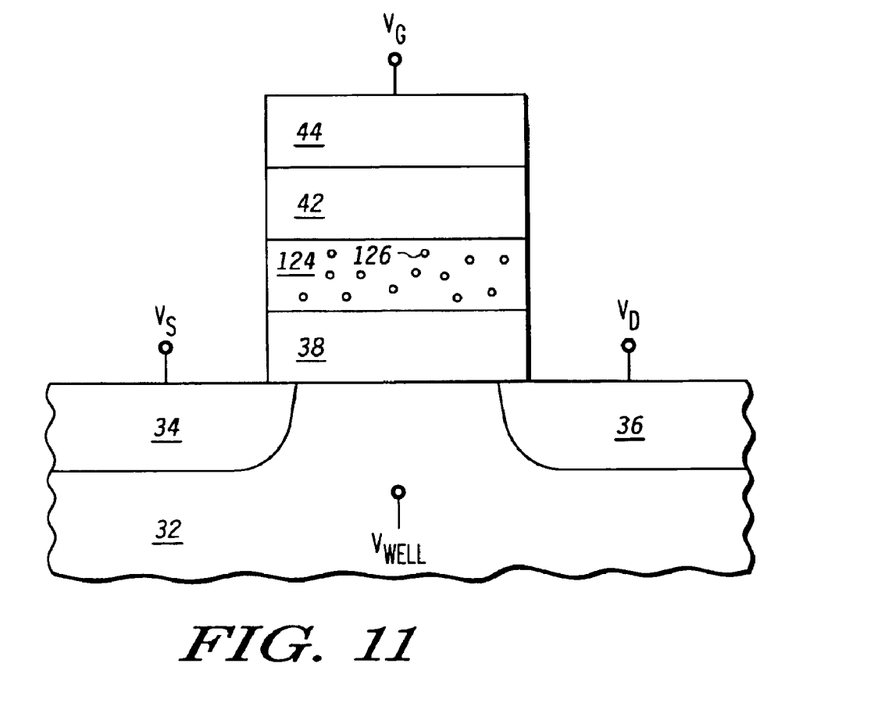
FIG. 11 illustrates in further detail another form of the charge storage element layer of the two bit memory cell described herein.

Illustrated in FIG. 11 is a further detail of another form of the memory cell 30 of FIG. 2 wherein the charge storage element layer 40 is implemented by a layer 124 of nitride or other material that contains charge trapping sites such as site 126. Again, for the convenience of illustration, elements in FIG. 10 that are equivalent or the same as in FIG. 2 are given the same number. The gate dielectric 38 is deposited or grown. Either a single layer or multiple layers of a material containing electron and/or hole trap sites, such as site 126, are deposited. All other components of the two bit memory cell, including the control dielectric 42 and the gate electrode 44 are formed as previously described.

By now it should be appreciated that there has been provided a memory and a programming method for use in a memory system in which the memory cells have a layer with discrete charge storage elements. A two step programming method is used to permit a significantly lower gate voltage than conventionally used in such memories. Selective modification or clean up of charge distribution within a central area of a two bit memory cell is implemented without adding significant additional time to the programming operation. The method programs at least one portion of a memory cell with a programmed value. Charge having a first polarity is injected into a first plurality of discrete charge storage elements within the memory cell. Charge having a second polarity is injected into a portion of the first plurality of discrete charge storage elements. The first plurality of discrete charge storage elements is used to represent the programmed value. The charge having the first polarity is injected by electrons and the charge having the second polarity is injected by holes. Before the injecting of charge having a first polarity, a determination is made whether a present logic state of the at least one portion of the memory cell is different than the programmed value. The programmed value is one of either a logic state one or a logic state zero. In one form the memory is a non-volatile memory. In another form the memory is an electrically erasable programmable memory. The memory cell has a first portion and a second portion wherein the first plurality of discrete charge storage elements are located in the first portion of the memory cell. A determination is made whether a present logic state of the first portion of the memory cell is different than the programmed value. If the present logic state of the first portion of the memory cell is different than the programmed value, the injection of charge having a first polarity occurs. A determination is made whether a second programmed value that is programmed into the second portion of the memory cell is different than the first programmed value. If the second programmed value is different than the first programmed value, injection of charge having a second polarity is made. Charge having the first polarity is injected into a second plurality of discrete charge storage elements within the second portion of the memory cell. Charge having the second polarity is injected into a portion of the second plurality of discrete charge storage elements. The second plurality of discrete charge storage elements are used to represent a second programmed value. Optionally, the memory cell is placed in an erased state before said step of injecting charge having a first polarity. The memory has circuitry for injecting charge having a first polarity into a first plurality of discrete charge storage elements within a portion of the memory. Circuitry injects charge having a second polarity into a portion of the first plurality of discrete charge storage elements. A programmed value is retrieved from the first plurality of discrete charge storage elements. The circuitry for injecting charge having the second polarity can concurrently inject charge to a plurality of memory cells within a row of the memory. In another form a memory cell has a first portion and a second portion, the first portion having a first state and the second portion having a second state. A sense amplifier is coupled to said memory cell wherein said sense amplifier senses the first state of said first portion and second state of said second portion. Program circuitry is coupled to the sense amplifier, whereby based on a comparison of the first state and second state, charge is selectively injected into at least one of said first portion and said second portion. The charge is selectively injected during programming of at least one portion of the memory cell. The charge has holes that are selectively injected during programming of at least one portion of the memory cell. The memory cell is located within a row of memory cells, and the charge is injected into a plurality of memory cells within the row based on logic states stored in the plurality of memory cells. The charge is selectively injected when the first state and said second state are of opposite states. The charge is made up of electrons.

In the foregoing specification, the invention has been described with reference to specific embodiments. However, one of ordinary skill in the art appreciates that various modifications and changes can be made without departing from the scope of the present invention as set forth in the claims below. For example, while the memory cells discussed herein were described as storing specific logic one and logic zero digital values, it should be understood that the programming method may be used to store information values that are other than logic one and logic zero values (i.e. a value that represents yet another state or value). Also, the storage medium may be a different dielectric than nitride, or for example may be silicon-nanocrystals inserted into silicon oxide. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for programming at least one portion of a memory cell with a first programmed value, the method comprising:
   injecting charge having a first polarity into a first plurality of discrete charge storage elements within the memory cell;
   injecting charge having a second polarity into a portion of the first plurality of discrete charge storage elements; and
   using the first plurality of discrete charge storage elements to represent the first programmed value.

2. A method as in claim 1, wherein the charge having the first polarity is injected by electrons and wherein the charge having the second polarity is injected by holes.

3. A method as in claim 1, further comprising:
   before said step of injecting charge having a first polarity, determining if a present logic state of the at least one portion of the memory cell is different than the first programmed value.

4. A method as in claim 1, wherein the first programmed value is one of a logic state one and a logic state zero.

5. A method as in claim 1, further comprising providing a plurality of memory cells in a memory that is a non-volatile memory.

6. A method as in claim 5, further comprising implementing the memory as an electrically erasable programmable memory.

7. A method as in claim 1, wherein the memory cell has a first portion and a second portion, and wherein the first plurality of discrete charge storage elements are located in the first portion of the memory cell.

8. A method as in claim 7, further comprising:
   determining if a present logic state of the first portion of the memory cell is different than the first programmed value;
   if the present logic state of the first portion of the memory cell is different than the first programmed value, performing said step of injecting charge having a first polarity;
   determining if a second programmed value to be programmed into the second portion of the memory cell is different than the first programmed value; and
   if the second programmed value is different than the first programmed value, performing said step of injecting charge having a second polarity.

9. A method as in claim 7, further comprising:
   injecting charge having a first polarity into a second plurality of discrete charge storage elements within the second portion of the memory cell;
   injecting charge having a second polarity into a portion of the second plurality of discrete charge storage elements; and
   using the second plurality of discrete charge storage elements to represent a second programmed value.

10. A method as in claim 1, further comprising:
    providing the memory cell in an erased state before said step of injecting charge having a first polarity.

11. A memory, comprising:
    means for injecting charge having a first polarity into a first plurality of discrete charge storage elements within a portion of the memory;
    means for injecting charge having a second polarity into a portion of the first plurality of discrete charge storage elements; and
    means for retrieving a programmed value from the first plurality of discrete charge storage elements.

12. A memory as in claim 11, wherein the means for injecting charge having the second polarity can concurrently inject charge to a plurality of memory cells within a row of the memory.

13. A memory as in claim 11, wherein the means for injecting charge having the second polarity can concurrently inject charge to a plurality of memory cells within a column of the memory.

14. A memory, comprising:
    a memory cell having a first portion and a second portion, said first portion having a first state and said second portion having a second state;
    a sense amplifier coupled to said memory cell wherein said sense amplifier senses the first state of said first portion and second state of said second portion; and
    program circuitry coupled to said sense amplifier, whereby based on a comparison of the first state and second state, charge is selectively injected into at least one of said first portion and said second portion.

15. A memory as in claim 14, wherein said charge is selectively injected during programming of at least one portion of the memory cell.

16. A memory as in claim 14, wherein said charge comprises holes which are selectively injected during programming of at least one portion of the memory cell.

17. A memory as in claim 16, wherein said memory cell is located within a row of memory cells, and wherein said charge is injected into a plurality of memory cells within the row based on logic states stored in the plurality of memory cells.

18. A memory as in claim 14, wherein said charge is selectively injected when the first state and said second state are of opposite states.

19. A memory as in claim 14, wherein said charge comprises electrons.

20. A memory as in claim 14, wherein the memory is a non-volatile memory.

21. A memory as in claim 14, wherein the memory is an electrically erasable programmable memory.

* * * * *